(12) United States Patent
Cheng et al.

(10) Patent No.: US 12,376,503 B2
(45) Date of Patent: Jul. 29, 2025

(54) PHASE CHANGE MATERIAL INCLUDING DEUTERIUM

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US); Arthur Roy Gasasira, Halfmoon, NY (US); Louis Zuoguang Liu, Schenectady, NY (US); Amlan Majumdar, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 273 days.

(21) Appl. No.: 18/188,729

(22) Filed: Mar. 23, 2023

(65) Prior Publication Data

US 2024/0324475 A1    Sep. 26, 2024

(51) Int. Cl.
*H10N 70/20* (2023.01)
*G11C 13/00* (2006.01)
*H10N 70/00* (2023.01)

(52) U.S. Cl.
CPC ....... *H10N 70/231* (2023.02); *G11C 13/0004* (2013.01); *G11C 13/0069* (2013.01); *H10N 70/023* (2023.02); *H10N 70/063* (2023.02); *H10N 70/066* (2023.02); *H10N 70/841* (2023.02); *H10N 70/8613* (2023.02)

(58) Field of Classification Search
CPC .. H10N 70/231; H10N 70/023; H10N 70/063; H10N 70/066; H10N 70/841; H10N 70/8613; G11C 13/0004; G11C 13/0069
See application file for complete search history.

(56) References Cited

U.S. PATENT DOCUMENTS

| | | |
|---|---|---|
| 8,039,297 B2 | 10/2011 | Kim |
| 8,987,046 B2 | 3/2015 | Sekar |
| 10,573,809 B2 | 2/2020 | Majhi |
| 2010/0051893 A1* | 3/2010 | Kim ............... H10N 70/041 257/E47.001 |
| 2013/0129603 A1 | 5/2013 | Xiao |
| 2013/0221311 A1* | 8/2013 | Sekar ............... H10N 70/826 257/2 |
| 2019/0036020 A1* | 1/2019 | Majhi ............... H10N 70/826 |
| 2021/0249593 A1* | 8/2021 | Lai ............... G11C 13/0004 |
| 2021/0408019 A1 | 12/2021 | Makala |

FOREIGN PATENT DOCUMENTS

| | | |
|---|---|---|
| WO | 2013134757 A1 | 9/2013 |
| WO | 2017181418 A1 | 10/2017 |

* cited by examiner

*Primary Examiner* — Jerome Leboeuf
(74) *Attorney, Agent, or Firm* — Matthew Zehrer

(57) ABSTRACT

The density of deuterium or hydrogen within phase change material (PCM) of a PCM memory cell reduces the active defects in the amorphous phase of the PCM by passivating dangling bonds, which results in the PCM becoming easier to nucleate during the SET process of the PCM memory cell. Resultingly, the addition of deuterium or hydrogen within the PCM relatively increases the SET programming voltage window of the PCM memory cell compared with a similar PCM cell without.

18 Claims, 6 Drawing Sheets

100

200

PHASE CHANGE MATERIAL INCLUDING DEUTERIUM

FIELD

Embodiments of the disclosure relate generally to the field of semiconductor devices and, more particularly, to memory devices that include a phase change material with deuterium therein.

BACKGROUND

Phase change material (PCM) memory is a non-volatile solid-state memory technology that exploits reversible, thermally-assisted switching of a phase change material (PCM), such as chalcogenide compounds such as Germanium-Antimony-Tellurium (GST), between states with different electrical resistance. The fundamental storage unit (the "cell") can be programmed into a number of different states, or levels, which exhibit different resistance characteristics. The programmable cell-states can be used to represent different data values, permitting storage of information.

In PCM memory cells, each cell can be set to at least 2 states, a "SET" state and a "RESET" state, permitting storage of one bit per PCM cell. In the RESET state, which corresponds to a wholly maximally amorphous state of the phase-change material, the electrical resistance of the PCM cell is relatively high. By applying a set voltage, set voltage pulse, or the like, collectively referred to as Vs, the PCM is heated to a temperature above its crystallization point and then cooled, upon which the PCM is transformed into a low-resistance, crystalline, or SET state. By applying a reset voltage, reset voltage pulse, or the like, collectively referred to as Vr, the PCM is heated to a relatively higher temperature, above the melting point of the PCM. Upon rapid cooling of the PCM, the PCM reverts to the amorphous RESET state.

Reading and writing of data in the PCM cell may be achieved by applying appropriate voltages across the PCM. In a write operation, the resulting programming signal causes Joule heating of the PCM to an appropriate temperature to induce the desired PCM cell state on cooling. Reading of the PCM cell is performed using cell resistance as a metric for the PCM cell state. An applied read voltage causes a current to flow through the PCM cell, this read current being dependent on resistance of the PCM cell. Measurement of the PCM cell read current therefore provides an indication of the programmed PCM cell state. A sufficiently low read voltage is used for this resistance metric to ensure that application of the read voltage does not disturb the programmed PCM cell state. PCM cell state detection can then be performed by comparing the measured red resistance or read current metric with predefined reference levels to determine the PCM cell state or stored data value associated therewith.

To increase the likelihood of proper or desired PCM cell state switching or programming, it may be beneficial to design the PCM cell with a relatively large SET programming window. In other words, it may be beneficial to increase the SET programming window to compensate the variations in SET programing voltage amplitude for various PCM cells. The amorphous state of the phase change material can be switched to a crystalline state by being subjected to a recrystallization process, which may also be referred to as a SET process. Dangling bonds are active defects in the amorphous phase or phase change materials.

SUMMARY

In an embodiment of the present disclosure, a phase change material memory cell is presented. The phase change material memory cell includes a top electrode in contact with a phase change material (PCM). Application of an electrical potential to the PCM changes a detectable resistance of the PCM, wherein the detectable resistance of the PCM represents a data value. The PCM comprises infused deuterium therewithin.

In an example, the infused deuterium within the PCM reduces the active defects in the amorphous phase of the PCM by passivating dangling bonds, which results in the PCM becoming easier to nucleate during the SET process. As a result, the addition of deuterium within the PCM relatively increases the SET programming voltage window of the PCM memory cell, compared with a similar PCM cell without the deuterium.

In an example, the phase change material memory cell further includes a top electrode upon an upper surface of the PCM and a heater upon a lower surface of the PCM. The PCM is serially connected to the top electrode and is serially connected to the heater. The electrical potential applied to the PCM may be applied to the heater.

In an example, the phase change material memory cell further includes an encapsulation spacer upon a sidewall of the PCM and upon a sidewall of the top electrode.

In an example, a concentration of deuterium is homogenous through the PCM. In another example, a concentration of deuterium is graded from a high concentration of deuterium at a first surface of the PCM to lower concentrations of the deuterium away from the first surface of the PCM. The first surface of the PCM may be an upper surface of the PCM, a side surface of the PCM, or the like.

In another embodiment of the present disclosure, an integrated circuit (IC) device fabrication method is presented. The method includes forming a heater layer upon an underlying layer and forming a heater within the heater layer. The heater is formed above and vertically in-line with an underlying bottom wire. The method further includes forming a phase change material (PCM) layer upon the heater and upon the heater layer and infusing deuterium within the PCM layer.

In an example, the infused deuterium within the PCM reduces the active defects in the amorphous phase of the PCM by passivating dangling bonds, which results in the PCM becoming easier to nucleate during the SET process. As a result, the addition of deuterium within the PCM relatively increases the SET programming voltage window of the PCM memory cell, compared with a similar PCM cell without the deuterium.

In an example, the method further includes forming a top electrode layer directly upon the PCM layer and patterning the top electrode layer and the PCM layer to form a PCM cell stack. The PCM cell stack includes a PCM and a top electrode. The application of an electrical potential to the PCM changes a detectable resistance of the PCM which represents a data value.

In further examples, the method further includes forming an encapsulation spacer upon a sidewall of the PCM cell stack, forming an inter-layer dielectric (ILD) layer comprising an ILD top surface above a top surface of the PCM cell stack, and/or forming a top wire within the ILD, that is serially connected to the top electrode of the PCM cell stack.

In an example, a concentration of deuterium is graded from a high concentration of deuterium at an upper surface of the PCM layer to lower concentrations of the deuterium vertically away from the upper surface of the PCM layer.

In yet another embodiment of the present disclosure, an integrated circuit (IC) device fabrication method is provided. The method includes forming a heater layer upon an underlying layer and forming a heater within the heater layer. The heater being formed above and vertically in-line with an underlying bottom wire. The method further includes forming a phase change material (PCM) layer upon the heater and upon the heater layer. The method further includes forming a top electrode layer directly upon the PCM layer. The method further includes patterning the top electrode layer and the PCM layer to form a PCM cell stack. The PCM cell stack includes a PCM and a top electrode. Application of an electrical potential to the PCM changes a detectable resistance of the PCM which represents a data value. The method further includes, after forming the PCM cell stack, infusing deuterium within the PCM.

In an example, the infused deuterium within the PCM reduces the active defects in the amorphous phase of the PCM by passivating dangling bonds, which results in the PCM becoming easier to nucleate during the SET process. As a result, the addition of deuterium within the PCM relatively increases the SET programming voltage window of the PCM memory cell, compared with a similar PCM cell without the deuterium.

In further examples, the method further includes forming an encapsulation spacer upon a sidewall of the PCM cell stack, forming an inter-layer dielectric (ILD) layer that includes an ILD top surface above a top surface of the PCM cell stack, and/or forming a top wire within the ILD. The top wire is electrically serially connected to the top electrode of the PCM cell stack.

In a further example, a concentration of deuterium is graded from a high concentration of deuterium at a side surface of the PCM layer to lower concentrations of the deuterium toward a center of the PCM layer.

These and other embodiments, features, aspects, and advantages will become better understood with reference to the following description, appended claims, and accompanying drawings.

BRIEF DESCRIPTION OF THE DRAWINGS

So that the manner in which the above recited features of the present disclosure are attained and can be understood in detail, a more particular description of the disclosure, briefly summarized above, may be had by reference to the embodiments thereof which are illustrated in the appended drawings.

It is to be noted, however, that the appended drawings illustrate only typical embodiments of this disclosure and are therefore not to be considered limiting of its scope, for the disclosure may admit to other equally effective embodiments.

The drawings are not necessarily to scale. The drawings are merely schematic representations, not intended to portray specific parameters. The drawings are intended to depict only exemplary embodiments of the disclosure. In the drawings, like numbering represents like elements.

DETAILED DESCRIPTION

Figure 1:
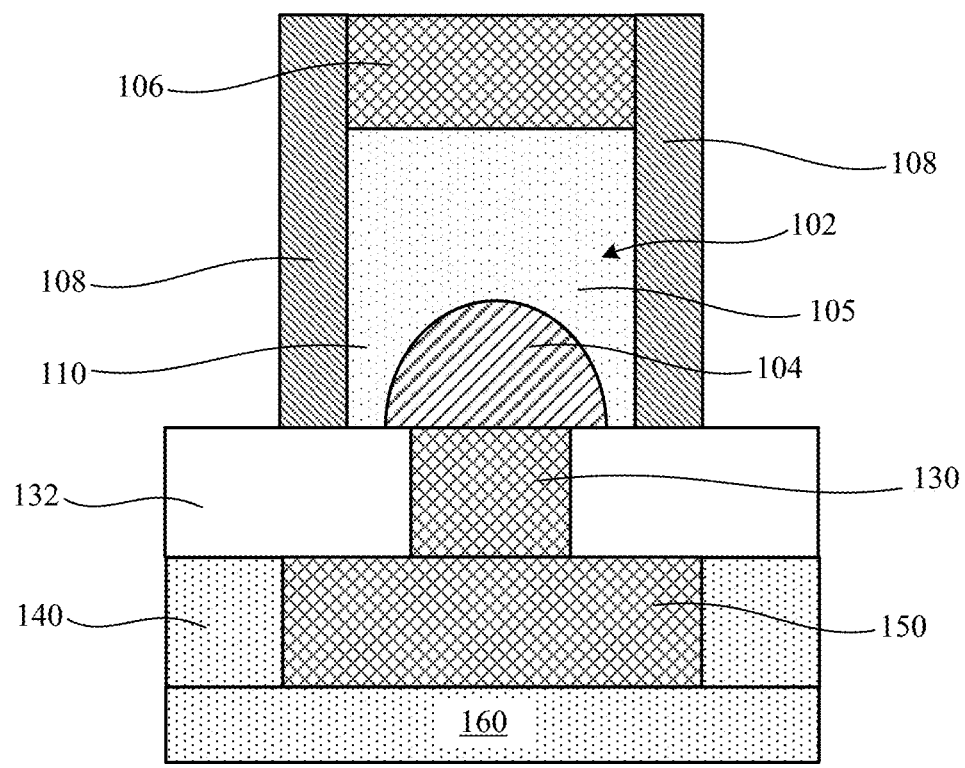
FIG. 1 depicts a cross section of a PCM memory cell that includes a PCM with deuterium therein, in accordance with various embodiments of the present disclosure.

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this disclosure to those skilled in the art. In the description and drawings, details of well-known features and techniques may be omitted to avoid unnecessarily obscuring the presented embodiments.

Referring to the drawings, wherein like components are labeled with like numerals, exemplary fabrication steps of forming an IC device that includes one or more PCM memory cells 100, are shown and described in greater detail below. It should be noted that while this description may refer to some components of the IC device in the singular tense, more than one component may be included within the IC device. The specific components depicted in the drawings and the cross-section orientation was chosen to best illustrate the various embodiments described herein.

FIG. 1 depicts a cross section of PCM memory cell 100 that includes a PCM 102 with deuterium 105 therein. In addition to PCM 102, PCM memory cell 100 may further include bottom electrode 150, heater 130, top electrode 106, and spacers 108. Bottom electrode 150 may be formed within a dielectric layer 140 and heater 130 may be formed within a heater layer 132. The PCM memory cell 100 may be formed upon a semiconductor substrate 160 which may include numerous microdevices, such as field effect transistors (FETs), diodes, or the like, formed therein.

PCM memory cell 100 can be set to at least 2 states, a "SET" state and a "RESET" state, permitting storage of one-bit therewithin. In the RESET state, which corresponds to an amorphous state of the PCM 102, the electrical resistance across the PCM memory cell 100 between bottom electrode 150 and top electrode 106 is relatively high. By applying a set voltage, set voltage pulse, or the like, collectively referred to as Vs, PCM 102 is heated to a temperature above its crystallization point. Upon cooling, PCM 102 is effectively placed into its low-resistance, fully-crystalline state. This low-resistance state provides the SET state of PCM memory cell 100. By applying a reset voltage, reset voltage pulse, or the like, collectively referred to as Vr, PCM 102 is heated to a relatively higher temperature, above the melting point of PCM 102. Upon rapid cooling of the PCM 102, the PCM 102 reverts to its high-resistance state and provides the RESET state of PCM memory cell 100.

Reading and writing of data in PCM memory cell 100 is achieved by applying appropriate voltages across PCM 102. In a write operation, an applied voltage which may also be referred to as a programming signal causes Joule heating of the PCM 102 to an appropriate temperature to induce the desired SET or RESET state upon cooling of PCM 102. Reading of PCM memory cell 100 is performed using the resistance across the PCM memory cell 100 as a metric for PCM memory cell 100 state. An applied read voltage causes a read current to flow through the PCM memory cell 100. The relationship between the applied read voltage and the resulting read current is dependent on state (e.g., SET, RESET, or the like) and resistance across the PCM memory cell 100. Measurement of the read current through PCM memory cell 100 therefore provides an indication of the programmed PCM memory cell 100 state. A sufficiently low read voltage may be used to ensure that application of the read voltage does not disturb the programmed PCM memory cell 100 state. In accordance therewith, PCM memory cell 100 cell state detection can be performed by comparing the read current or derived resistance metric with predefined levels to determine the state of PCM memory cell 100 or stored data value associated therewith.

PCM memory cell 100 includes the PCM 102 located between a top electrode 106 and bottom electrode 150. An exemplary PCM memory cell 100 state depicted represents an intermediate state in which the PCM 102 contains both crystalline and amorphous phases. The amorphous phase is indicated by the shaded hemispherical volume 104 above heater 130. The crystalline phase occupies the remainder of the PCM 102 volume. When a read voltage is applied to read the programmed PCM memory cell 100 state, the resulting read current flows primarily via this current path from crystalline phase to bottom electrode 150, in preference to flowing through the high-resistance amorphous phase 104.

The density of deuterium 105 within PCM 102 reduces the active defects in the amorphous phase of PCM 102 by passivating dangling bonds, which results in PCM 102 becoming easier to nucleate during the SET process. Generally, the crystallization transformation of PCM 102 can be divided into two processes: (1) a crystal-nucleation process and (2) a crystal-growth process. When the crystal nuclei appear in the melted amorphous material at elevated temperature, these nuclei can then gradually grow larger, and the whole active region of PCM 102 will be in the crystalline state, which is equivalent to the transformation from RESET to SET state. As such, the addition of deuterium 105 within PCM 102 relatively increases the SET programming voltage window of the PCM memory cell 100 that includes PCM 102 with deuterium 105 therein, compared with a similar PCM cell without.

Figure 4:
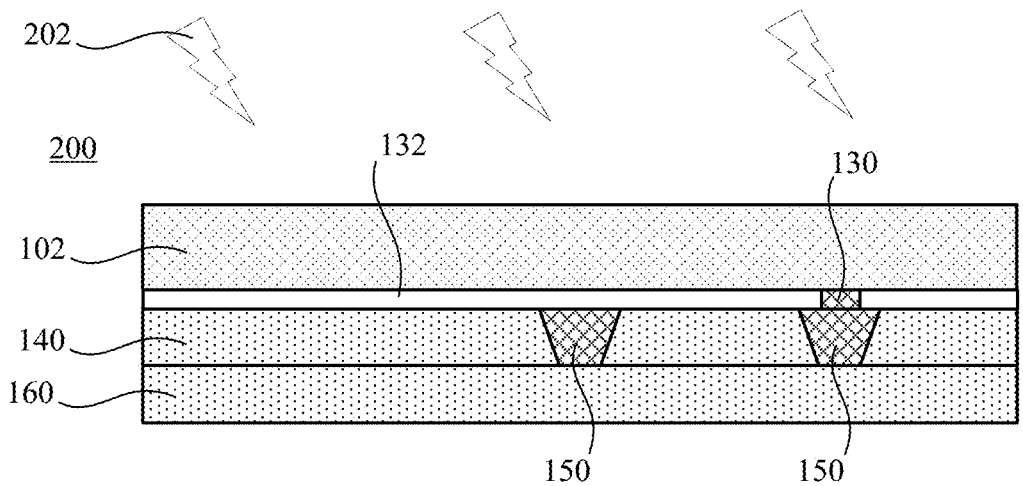
Figure 6:
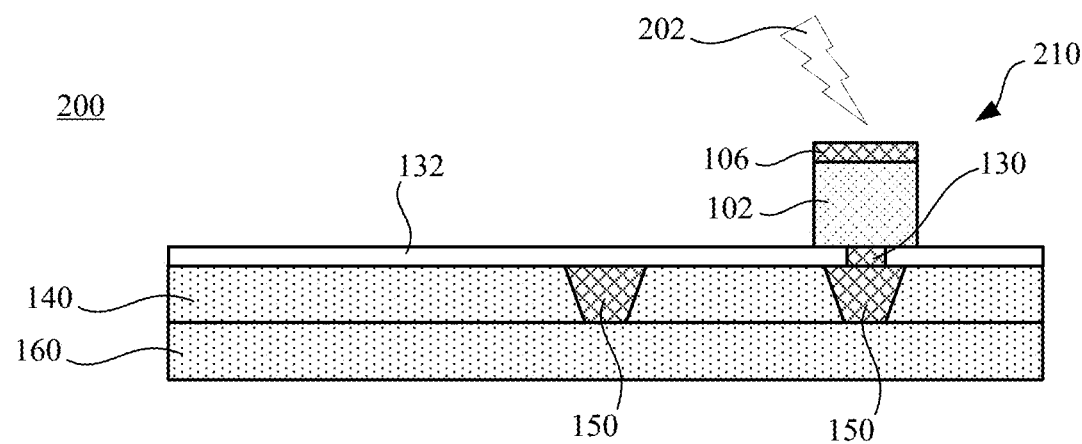
Figure 7:
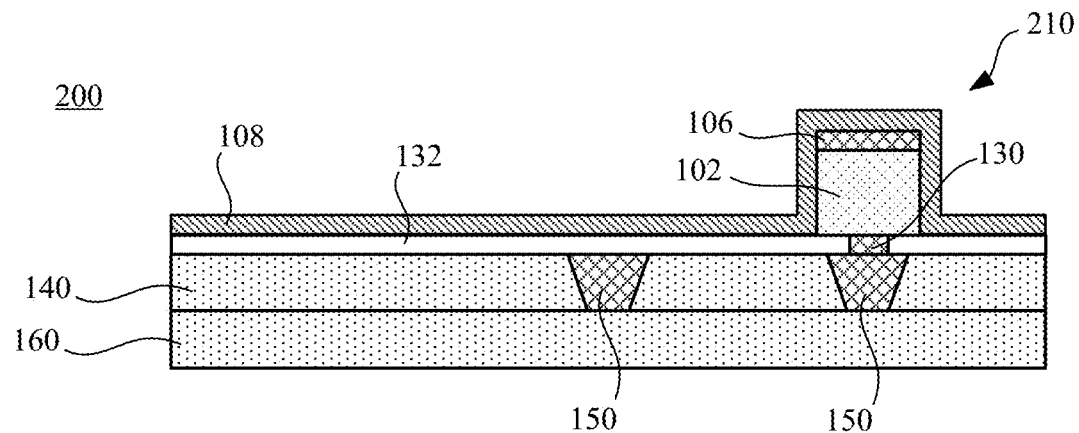
Figure 8:
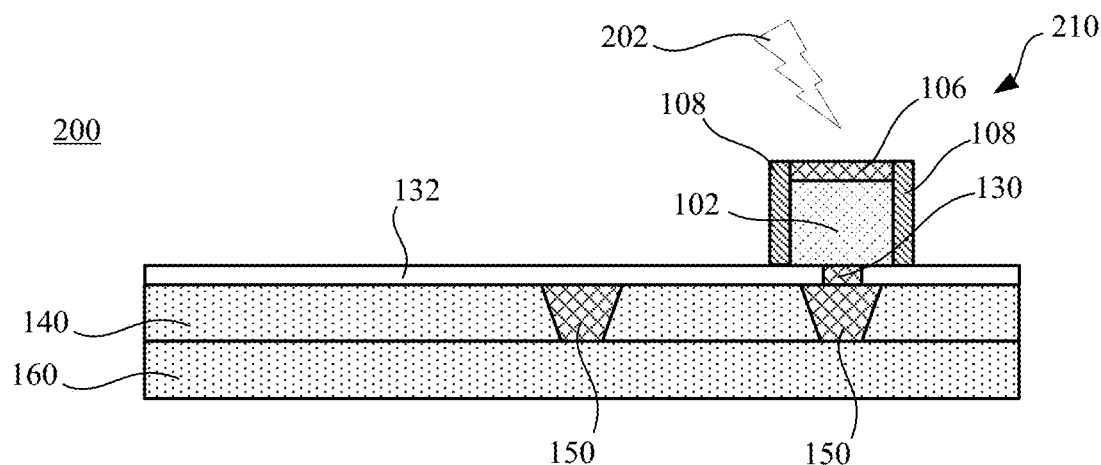
Figure 11:
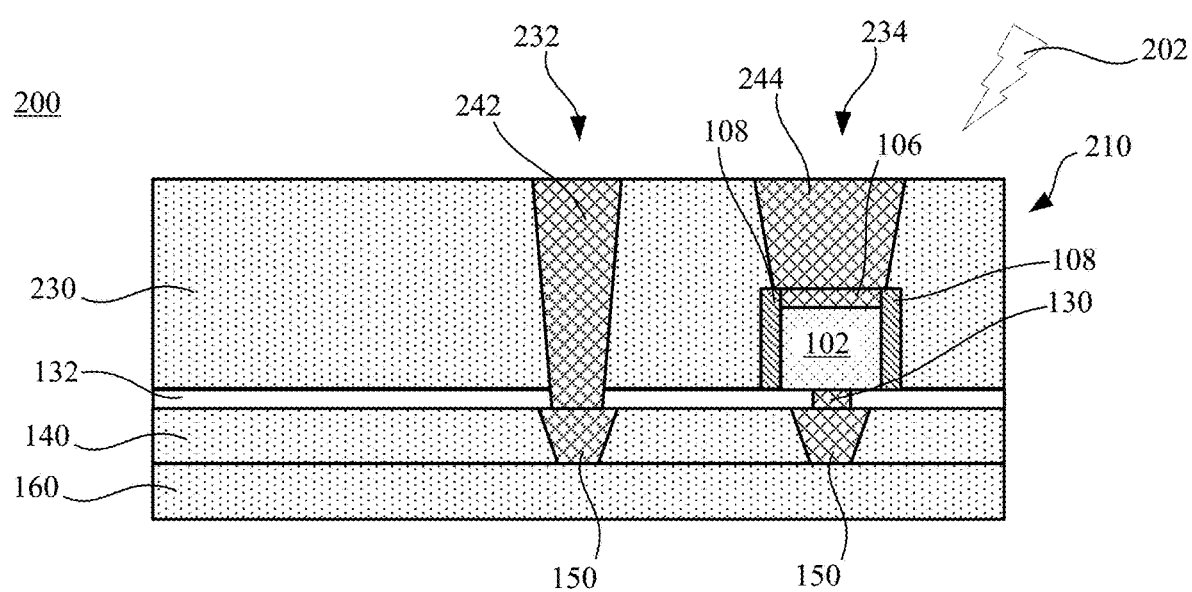

For example, during fabrication of PCM memory cell 100 or after fabrication of PCM memory cell 100, an associated IC device that which contains PCM memory cell 100 may be subjected to an anneal in an environment including a deuterium-containing gas to impart deuterium 105 within PCM 102, which may be referred herein as the deuterium anneal 202. For example, the deuterium anneal 202 may be performed after PCM 102 layer is formed, as depicted in FIG. 4, after PCM memory cell 100 is patterned, as depicted in FIG. 6, after top electrode 106 and/or encapsulation spacer (s) 108 formation, as depicted in FIG. 8, after top wire 244 is formed, as depicted in FIG. 11. Examples of the deuterium anneal 202 parameters are described below.

To anneal the applicable structure, the structure can be placed in a sealed environment. The atmosphere of the sealed environment is purged with, or pumped to a base pressure and backfilled with, a deuterium-containing gas. The deuterium-containing gas is a gas including at least one deuterium atom. A deuterium atom is an isotope of a hydrogen atom that includes one proton and one neutron in the nucleus. In one embodiment, the deuterium-containing gas can be deuterium gas, which consists of two deuteron atoms bonded to each other by a covalent bonding. Deuterium gas of purity not less than 99%, and up to 99.999%, can be commercially purchased, for example, from Praxair™, Advanced Specialty Gases™, BOC Industrial Gases™, and Electronic Fluorocarbons LLC.

The partial pressure of the deuterium-containing gas in the anneal ambient can be sub-atmospheric, atmospheric, or super-atmospheric depending on the apparatus in which the anneal is performed. In one embodiment, the partial pressure of the deuterium-containing gas can be in a range from 0.1 times the atmospheric pressure (atm) to 30 times the atmospheric pressure. The total pressure of the anneal ambient can be the same as the partial pressure of the deuterium-containing gas or can be greater than the partial pressure of the deuterium containing gas. If the total pressure of the anneal ambient is greater than the partial pressure of the deuterium-containing gas, at least one gas that does not include deuterium can be present in the anneal ambient. The gas that does not include deuterium may include, but is not limited to, argon, xenon, neon, nitrogen. In one embodiment, the partial pressure of the at least one gas that does not include deuterium can be not greater than 90% of the total pressure of the anneal ambient. In another embodiment, the partial pressure of the at least one gas that does not include deuterium can be not greater than 50% of the total pressure of the anneal ambient. In yet another embodiment, the partial pressure of the at least one gas that does not include deuterium can be not greater than 10% of the total pressure of the anneal ambient.

In one embodiment, the anneal ambient can consist essentially of a deuterium-containing gas. In one embodiment, the anneal ambient can consist essentially of deuterium gas of purity greater than 99%. In one embodiment, the pressure of the anneal ambient can be in a range from 0.1 atm to 30 atm. In another embodiment, the pressure of the anneal ambient can be about the atmospheric pressure. In another embodiment, the pressure of the anneal ambient can be greater than 1 atm (for example, from 1.2 atm to 25 atm). In yet another embodiment, the pressure of the anneal ambient can be in a range from 1 atm to 5 atm. In still another embodiment, the pressure of the anneal ambient can be in a range from 5 atm to 25 atm.

The temperature of the anneal can be in a range from 20 degrees Celsius to 600 degrees Celsius, although lower and higher temperatures can also be employed. In one embodiment, the temperature of the anneal can be an elevated temperature, i.e., a temperature that is higher than room temperature of 20 degrees Celsius. In one embodiment, the temperature of the anneal can be in a range from 300 degrees Celsius to 500 degrees Celsius. In one embodiment, the temperature of the anneal can be in a range from 350 degrees Celsius to 400 degrees Celsius. In another embodiment, the temperature of the anneal can be in a range from 400 degrees Celsius to 450 degrees Celsius.

The duration of the anneal can be in a range from 1 minute to 20 hours, although lesser and greater durations can also be employed. In one embodiment, the duration of the anneal can be in a range from 30 minute to 60 minutes. In another embodiment, the duration of the anneal can be in a range from 60 minutes to 2 hours. In yet another embodiment, the duration of the anneal can be in a range from 2 hours to 20 hours.

During the deuterium anneal 202, deuterium atoms impinge on the surfaces of the PCM 102 and diffuse into the PCM 102 forming deuterium 105 within the PCM 102.

Hydrogen atoms within the PCM 102 and/or at PCM 102 and surrounding material interfaces and are replaced with deuteron atoms during the anneal in the anneal environment that includes the deuterium-containing gas. Also, some dangling bonds or traps inside the PCM 102 and/or at PCM 102 are bonded by deuterium atoms during the anneal.

The processing parameters of deuterium anneal 202 can be selected so that the density of deuterium atoms in PCM 102 is in a range from $1.0 \times 10^{17}/cm^3$ to $1.0 \times 10^{22}/cm^3$, and/or the surface density of deuterium atoms in PCM 102 is in the range of $1.0 \times 10^9/cm^2$ to $1.0 \times 10^{14}/cm^2$ after the anneal. In one embodiment, the processing parameters of deuterium anneal 202 can be selected so that the density of deuterium atoms in PCM 102 is in a range from $1.0 \times 10^{17}/cm^3$ to $1.0 \times 10^{18}/cm^3$ after the anneal. In another embodiment, the processing parameters of deuterium anneal 202 can be selected so that the density of deuterium atoms in the PCM 102 is in a range from $1.0 \times 10^{18}/cm^3$ to $1.0 \times 10^{19}/cm^3$ after the anneal. In yet another embodiment, the processing parameters of deuterium anneal 202 can be selected so that the density of deuterium atoms in PCM 102 is in a range from $1.0 \times 10^{19}/cm^3$ to $1.0 \times 10^{20}/cm^3$ after the anneal. In another embodiment, the processing parameters of the deuterium anneal 202 can be selected so that the density of deuterium atoms in the PCM 102 is in a range from $1.0 \times 10^{20}/cm^3$ to $5.0 \times 10^{20}/cm^3$ after the anneal. In another embodiment, the processing parameters of the deuterium anneal 202 can be selected so that the density of deuterium atoms in the PCM 102 is in a range from $5.0 \times 10^{20}/cm^3$ to $2.5 \times 10^{21}/cm^3$ after the anneal. In another embodiment, the processing parameters of the deuterium anneal 202 can be selected so that the density of deuterium atoms in the PCM 102 is in a range from $2.5 \times 10^{21}/cm^3$ to $5.0 \times 10^{21}/cm^3$ after the anneal.

The processing parameters of the deuterium anneal 202 can be selected so that the atomic percentage of deuterium atoms in the PCM 102 is in a range from 2 parts per million (p.p.m.) to 20% after the anneal. In one embodiment, the processing parameters of the deuterium anneal 202 can be selected so that the density of deuterium atoms in the PCM 102 is in a range from 2 p.p.m. to 20 p.p.m. after the anneal. In another embodiment, the processing parameters of the deuterium anneal 202 can be selected so that the density of deuterium atoms in the PCM 102 is in a range from 20 p.p.m. to 200 p.p.m. after the anneal. In yet another embodiment, the processing parameters of the deuterium anneal 202 can be selected so that the density of deuterium atoms in the PCM 102 is in a range from 200 p.p.m. to 0.2% after the anneal. In another embodiment, the processing parameters of the deuterium anneal 202 can be selected so that the density of deuterium atoms in the PCM 102 is in a range from 0.2% to 1% after the anneal. In another embodiment, the processing parameters of the deuterium anneal 202 can be selected so that the density of deuterium atoms in the PCM 102 is in a range from 1% to 5% after the anneal. In another embodiment, the processing parameters of the deuterium anneal 202 can be selected so that the density of deuterium atoms in the PCM 102 is in a range from 5% to 10% after the anneal.

PCM memory cell 100 may further include encapsulation spacer(s) 108 upon or otherwise connected to sidewall(s) or side boundary of the PCM 102 and the sidewall or the side boundary of the top electrode 106. An upper surface of the encapsulation spacer(s) 108 may be coplanar with the upper surface of top electrode 106 and a lower surface of the encapsulation spacer(s) 108 may be coplanar with the lower surface of the PCM 102. In some implementations, encapsulation spacer(s) 108 may be omitted and interlayer dielectric 230, shown for example in FIG. 9, may be formed upon or otherwise connected to sidewall(s) or side boundary of the PCM 102 and the sidewall or the side boundary of the top electrode 106.

The IC device that which includes PCM memory cell 100 may include top wiring features (e.g., top wire 244 and/or vertical interconnect access associated therewith, or the like) connected and/or in contact with the top surface of top electrode 106. The IC device that which includes PCM memory cell 100 may further include a bottom electrode 150 may be connected and/or in contact with the heater 130. The top wiring features and/or the bottom electrode 150 may be electrically connected to other components in the IC device, such as a memory controller, or the like, as is known in the art. The bottom electrode 150 may be formed within dielectric layer 140. The dielectric layer 140 and bottom electrode 150 may be formed upon substrate 160. Substrate 160 may include microdevices, such as numerous FETs, diodes, or the like. The microdevices may be formed upon and within substrate 160 with Front End of the Line (FEOL) fabrication techniques and be a part of other FEOL structures. The dielectric layer 140 and bottom electrode 150 may be fabricated with Middle of the Line (MOL) fabrication techniques and be a part of other MOL structures or may be located within a first or lowest contact layer(s) and formed with Back End of the Line (BEOL) fabrication techniques and be a part of other BEOL structures.

FIG. 2 through FIG. 12 depict cross-sectional views of fabrication stages of an IC device 200 that includes PCM memory cell 100 that is fabricated to include PCM 102 that contains deuterium 105 therein.

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on," or "positioned atop" mean that a first element, such as a first structure, is present on a second element, such as a second structure, wherein intervening elements such as an interface structure can be present between the first element and the second element. The term "direct contact," or the like, means that a first element, such as a first structure, and a second element, such as a second structure, are connected without any intermediary conducting, insulating, or semiconductor layers at the interface of the two elements. It should be noted that the term "selective to," such as, for example, "a first element selective to a second element," means that the first element can be etched, and the second element can act as an etch stop.

The terms "about," "substantially," "approximately," and variations thereof are intended to include the degree of error associated with measurement of the quantity based upon the equipment available at the time of filing the application. For example, substantial coplanarity between various materials can include an appropriate manufacturing tolerance of ±8%, ±5%, or ±2% difference between the coplanar materials.

For the sake of brevity, conventional techniques related to a semiconductor device and integrated circuit (IC) fabrication may or may not be described in detail herein. Moreover, the various tasks and process steps described herein can be incorporated into a more comprehensive procedure or process having additional steps or functionality not described in detail herein. Various steps in the manufacture of semiconductor devices and semiconductor-based ICs are well known, and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping, and patterning/lithography. A deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and, more recently, atomic layer deposition (ALD), among others. Removal/etching is any process that removes material from the wafer. Examples include etch processes (either wet or dry), chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light-sensitive polymer called a photoresist. To build the complex structures that make up a transistor and the many wires that connect the millions of transistors of a circuit, lithography and etch pattern transfer steps are repeated multiple times. Each pattern printed on the wafer is aligned to the previously formed patterns, and slowly the conductors, insulators, and selectively doped regions are built up to form the final device.

Figure 2:
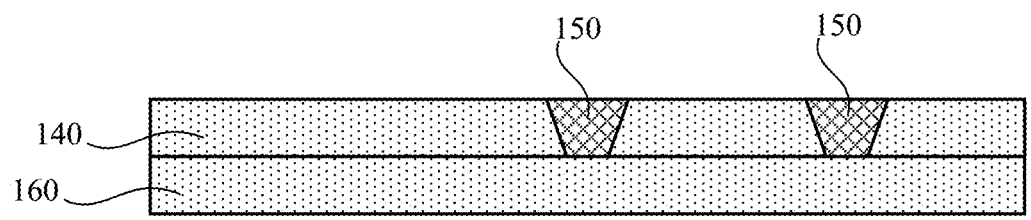
FIG. 2 through FIG. 11 depict cross-sectional views of fabrication stages of the formation of an integrated circuit (IC) device that includes a PCM memory cell that has a PCM with deuterium therein, in accordance with various embodiments of the present disclosure.

FIG. 2 depicts a cross-sectional view of an initial fabrication stage of fabricating IC device 200 that includes PCM memory cell 100 that is fabricated to include PCM 102 that contains deuterium 105 therein. At the present stage dielectric layer 140 is formed upon substrate 160 and bottom electrode 150 is formed within dielectric layer 140.

IC device 200 may be an integrated circuit (IC) chip. IC chips can be distributed by the fabricator in raw wafer form (that is, as a single wafer that has multiple unpackaged chips), as a bare die, or in a packaged form. In the latter case, the IC chip may mount in a single chip package (such as a plastic carrier, with leads that are affixed to a motherboard or other higher level carrier) or in a multichip package (such as a ceramic carrier that has either or both surface interconnections or buried interconnections). In any case, the IC chip may be integrated with other chips, discrete circuit elements, and/or other signal processing devices as part of either (a) an intermediate product, such as a motherboard, or (b) an end product. The end product can be any product that includes the IC chip, ranging from toys and other low-end applications to advanced computer products having a display, a keyboard or other input device, and a central processor.

The substrate 160 may be associated with a wafer, a bulk-semiconductor substrate, multilayered substrate, and/or the like. IC device fabrication techniques may form numerous microdevices, such as transistors, diodes, storage cells, arrays, gates, logic gates, controllers, or the like. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon (Si) is the predominantly used semiconductor material in wafer fabrication, alternative semiconductor materials can be employed, such as, but not limited to, gallium arsenide, gallium nitride, cadmium telluride, zinc selenide, and III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In another example, the substrate structure is multilayered and includes a bottom substrate and an insulator layer thereupon. The bottom substrate may be comprised of any other suitable material(s) that those listed above, and the insulator layer may be a dielectric layer, such as an oxide, and may be referred to as a buried oxide (BOX) layer. The dielectric layer may be any suitable dielectric, oxide, or the like, and it may electrically separate the nanostructures from the bottom substrate.

In one or more embodiments, the substrate 160 can be a semiconductor or an insulator with an active surface semiconductor layer. The substrate 160 can be crystalline, semicrystalline, microcrystalline, or amorphous. The substrate 160 can be essentially (i.e., except for contaminants) a single element (e.g., silicon), primarily (i.e., with doping) of a single element, for example, Si or germanium (Ge), or the substrate 160 can include a compound, for example, GaAs, SiC, or SiGe.

In some implementations, substrate 160 may be an interlayer dielectric (ILD) layer whereby additional layer(s) and/or structures or components of IC device 200 have previously been fabricated there below. The ILD can have a composition that is selected from the group consisting of silicon-containing materials such as $SiO_2$, $Si_3N_4$, $SiO_xN_y$, SiC, SiCO, SiCOH, and SiCH compounds, the above-mentioned silicon-containing materials with some or all of the Si replaced by Ge, carbon doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and diamond-like carbon (DLC), also known as amorphous hydrogenated carbon, α-C:H.

In embodiments, the dielectric layer 140 is an oxide-based material (e.g., $SiO_2$, SiN, or the like), e.g., interlevel dielectric (ILD) material, which can be deposited by a deposition method, e.g., chemical vapor deposition (CVD) upon substrate 160. The dielectric layer 140 can also be a low-k dielectric material (material with a lower dielectric constant relative to $SiO_2$), an insulator material with porosity, or the like. The dielectric 140 can also include one or more dielectric materials, including but not limited to, silicon nitride (SiN), silicon carbide (SiC), silicon oxynitride (SiON), carbon-doped silicon oxide (SiOC), carbon doped silicon oxide (SiO:C), fluorine-doped silicon oxide (SiO:F), silicon-carbon-nitride (SiCN), boron nitride (BN), silicon boron nitride (SiBN), silicoboron carbonitride (SiBCN), silicon oxycarbonitride (SiOCN), silicon oxide (SiO), boron carbon nitride (BCN), hydrogen silsesquioxane polymer (HSQ), methyl silsesquioxane polymer (MSQ), methyl doped silica (SiO:(CH$_3$)), organosilicate glass (SiCOH), porous SiCOH, and any suitable combinations thereof. The dielectric layer 140 can be formed by any suitable deposition technique, including but not limited to, chemical vapor deposition (CVD), spin-on, atomic layer deposition (ALD), etc.

The bottom electrode 150 can be formed by lithography, etching, and deposition methods. For example, a resist formed over the dielectric layer 140 is exposed to energy (light) to form a pattern (opening, trench, etc.). An etching process with a selective chemistry, e.g., reactive ion etching (RIE), will be used to form one or more patterns in the dielectric layer 140 through the openings of the resist. The resist can then be removed by a conventional oxygen ashing process or other known stripants. Following the resist removal, conductive material can be deposited in the one or more patterns by any conventional deposition processes, e.g., chemical vapor deposition (CVD) processes. The bottom electrode 150 can be composed of any conductive material such as, e.g., Cu, W. Co. Ni. Al, Ru, etc. In a particular implementation, the bottom electrode 150 are composed of Cu. The bottom electrode 150 can also be lined with a conductive barrier layer formed from Ti, Ta, TiN, TaN, Ru, Co, etc. Any residual conductive material on the surface of the dielectric layer 140 can be removed by chemical mechanical polishing (CMP) processes.

Bottom electrode 150 may be electrically connected to other components of the IC device 200 and/or electrical components connected to IC device 200 by one or more electrical pathways. For example, one or more electrical pathways (e.g., VIAs, wires, or the like) may connect bottom electrode 150 with a memory controller, or the like. Another one or more electrical pathways may connect top electrode 106 with the memory controller, or the like. In this manner, components of the IC device 200, or connected to the IC device 200, may be electrically connected to the PCM memory cell 100 via the bottom electrode 150 and/or the top electrode 106.

In an example, dielectric layer 140 and bottom electrode 150 can be a back end of the line (BEOL) or middle of the line (MOL) structure. In particular, the IC device 200 may includes a plurality of wiring levels, e.g., $M_0$ level to a $M_x$ level. In a particular example, dielectric layer 140 and bottom electrode 150 are in a lowest $M_0$ level for BEOL, or CA/CB level for MOL. In a particular example, dielectric layer 140 and bottom electrode 150 are in a highest $M_x$ level for BEOL.

Figure 3:
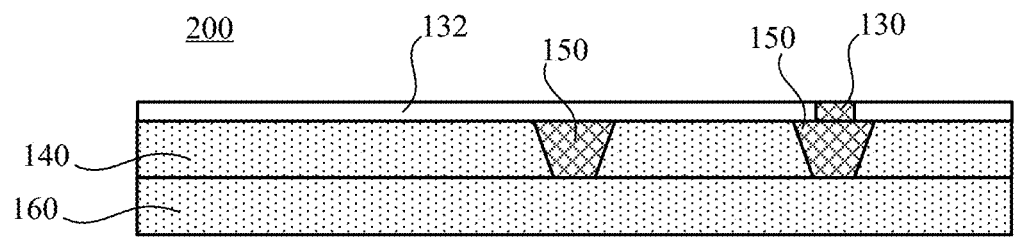

FIG. 3 depicts a cross-sectional view of a fabrication stage of fabricating IC device 200 that includes PCM memory cell 100 that is fabricated to include PCM 102 that contains deuterium 105 therein. At the present stage heating layer 132 and heater 130 are formed upon dielectric layer 140 and bottom electrode 150, respectively.

In embodiments, the heater layer 132 is an Si-based material (e.g., SiO$_2$, SiN, SiON, SiCN, SiOCN, SiBCN, SiOC, or the like), e.g., interlevel dielectric (ILD) material, which can be deposited by a deposition method, e.g., chemical vapor deposition (CVD) upon dielectric layer 140. In an example, at the present fabrication, stage the heater layer 132 may be deposited upon dielectric layer 140 as a blanket layer.

Heater 130 can be formed by lithography, etching, and deposition methods. For example, a resist formed over the heater layer 132 is exposed to energy (light) to form a pattern (opening, trench, etc.). An etching process with a selective chemistry, e.g., reactive ion etching (RIE), will be used to form one or more patterns in the heater layer 132 through the openings of the resist. The resist can then be removed by a conventional oxygen ashing process or other known stripants. Following the resist removal, conductive material can be deposited in the one or more patterns by any deposition process. The heater 130 can be made of a single material (e.g., TiN) or multiple-layered materials (e.g., TaN/TiN/TaN). Other suitable, conductive materials are also contemplated. Other heater conductor materials include: hafnium nitride (HfN), niobium nitride (NbN), WN, tungsten carbon nitride (WCN), or combinations thereof. The heater 130 can be deposited in the trench(es) by ALD, CVD, metal organic CVD (MOCVOD), plasma-enhanced CVD (PECVD), or combinations thereof. The heater 130 can also be lined with a conductive barrier layer. Any residual conductive material on the surface of the heater layer 132 can be removed by CMP processes. In an example, the material utilized to form heater 130 may be chosen to achieve a predetermined temperature therein upon when a potential is applied thereto. As such, the heater 130 may be the mechanism to heat the PCM 102 to its SET state and to its RESET state.

Heater 130 may be physically and/or electrically connected to bottom electrode 150. As such, heater 130 may be connected to other components of the IC device 200 and/or electrical components connected to IC device 200 by the one or more electrical pathways that may be connected to bottom electrode 150.

FIG. 4 depicts a cross-sectional view of a fabrication stage of fabricating IC device 200 that includes PCM memory cell 100 that is fabricated to include PCM 102 that contains deuterium 105 therein. At the present stage, PCM 102 is deposited upon heating layer 132 and heater 130 and deuterium anneal 202 may be performed to diffuse deuterium within the PCM 102.

PCM 102 is deposited upon heating layer 132 and heater 130. PCM 102 may be formed of a phase change material that exhibits reversible, thermally assisted state switching or changing with relatively different electrical resistances. Phase change materials may be chalcogenide compounds, such as germanium-antimony-tellurium (Ge—Sb—Te), Si—Sb—Te (silicon-antimony-tellurium) alloys, Ga—Sb—Te (gallium-antimony-tellurium) alloys, Ge—Bi—Te (germanium-bismuth-tellurium) alloys, In—Te (indium-tellurium) alloys, As—Sb—Te (arsenicantimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, and combinations thereof. PCM 102 may be deposited upon heating layer 132 to a thickness of 50-500 nm, although smaller and larger thickness can also be employed. In an example, at the present fabrication, stage PCM 102 may be deposited upon heater layer 132 as a blanket layer.

For clarity, as depicted in FIG. 1, PCM 102 may be selected to achieve or enable a mushroom type PCM memory cell 100 that results in a growing mushroom amorphous hemispherical volume 104 above heater 130 when the state of PCM memory cell 100 changes from its LRS to its HRS. PCM 102 may also be selected to achieve or enable other types of PCM memory cell 100 types, such as a bridge PCM cell type, confined PCM cell type, or the like.

Deuterium anneal 202 may be performed at the present fabrication stage, after PCM 102 is formed upon heating layer 132 and heater 130. The present structure of IC device 200 may be placed in a sealed environment. The atmosphere of the sealed environment is purged with, or pumped to a base pressure and backfilled with, a deuterium-containing gas. The partial pressure of the deuterium-containing gas in the anneal ambient can be sub-atmospheric, atmospheric, or super-atmospheric depending on the apparatus in which the anneal is performed. In one embodiment, the anneal ambient can consist essentially of a deuterium-containing gas. The temperature of the anneal can be in a range from 350 degrees Celsius to 450 degrees Celsius, although lower and higher temperatures can also be employed. The duration of the anneal can be in a range from 60 minute to 2 hours, although lesser and greater durations can also be employed.

During the deuterium anneal 202, deuterium atoms impinge on the surfaces of the PCM 102 and diffuse into the PCM 102 forming deuterium 105 within the PCM 102. Hydrogen atoms within the PCM 102 and/or at PCM 102 and surrounding material interfaces and are replaced with deuteron atoms during the anneal in the anneal environment that includes the deuterium-containing gas. Also, some dangling bonds or traps inside the PCM 102 and/or at PCM 102 are bonded by deuterium atoms during the anneal.

The processing parameters of deuterium anneal 202 can be selected so that the density of deuterium 105 within PCM 102 reduces the active defects in the amorphous phase of PCM 102 by passivating dangling bonds, which results in PCM 102 becoming easier to nucleate during the SET process. Generally, the crystallization transformation of PCM 102 can be divided into two processes: (1) a crystal-nucleation process and (2) a crystal-growth process. When the crystal nuclei appear in the melted amorphous material at elevated temperature, these nuclei can then gradually grow larger, and the whole active region of PCM 102 will be in the crystalline state, which is equivalent to the transformation from RESET to SET state. As such, the addition of deuterium 105 within PCM 102 relatively increases the SET programming voltage window of the PCM memory cell 100 that includes PCM 102 with deuterium 105 therein, compared with a similar PCM cell without.

Figure 5:
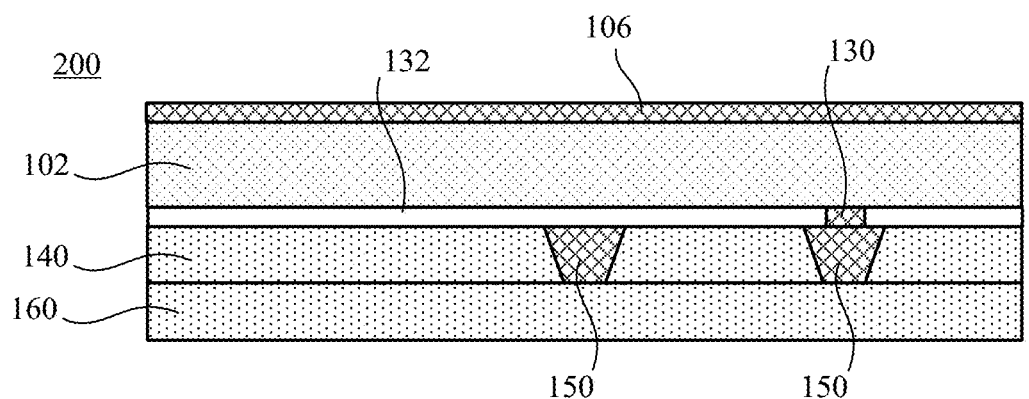

FIG. 5 depicts a cross-sectional view of a fabrication stage of fabricating IC device 200 that includes PCM memory cell 100 that is fabricated to include PCM 102 that contains deuterium 105 therein. At the present stage, a top electrode 106 layer may be deposited upon PCM 102.

The top electrode 106 can be formed by deposition of the electrode material followed by patterning. The top electrode 106 material can be tungsten (W), aluminum (Al), copper (Cu), cobalt (Co), nickel (Ni), titanium (Ti), ruthenium (Ru), molybdenum (Mo), or any other suitable conductive material. The metal contact can further include a barrier layer. The barrier layer can be TiN, TaN, HfN, NbN, WN, WCN, or combinations thereof. In various embodiments, the barrier layer can be deposited in the trench(es) by ALD, CVD, MOCVD, PECVD, or combinations thereof. In various embodiments, the top electrodes can be formed by ALD, CVD, PVD, and/or plating. In an example, the material of bottom electrode 150 and top electrode 106 may be the same conductive material. In another example, the material of bottom electrode 150 and top electrode 106 may be the same conductive material and the material of heater 130 may have greater conductivity relative to the material of bottom electrode 150 and top electrode 106. In another example, the material of bottom electrode 150 and top electrode 106 may be the same conductive material and the material of heater 130 may achieve a relatively higher temperature relative to the material of bottom electrode 150 and top electrode 106, when an electrical current passes across PCM cell 100. In another example, the material of bottom electrode 150, heater 130, and top electrode 106 all may be the same conductive material.

FIG. 6 depicts a cross-sectional view of a fabrication stage of fabricating IC device 200 that includes PCM memory cell 100 that is fabricated to include PCM 102 that contains deuterium 105 therein. At the present stage, PCM stack 210 which comprises a patterned PCM 102 and patterned top electrode 106 is formed and deuterium anneal 202 may be performed to diffuse deuterium within the PCM 102.

PCM stack 210 can be formed by lithography, etching, and deposition methods. For example, a resist formed over the top electrode 106 layer is exposed to energy (light) to form a pattern (opening, trench, etc.). An etching process with a selective chemistry, e.g., reactive ion etching (RIE), may be used to form one or more patterns in the top electrode 106 layer and the PCM 102 layer through the openings of the resist. The resist can then be removed by an oxygen ashing process or other known stripants. Vertically aligned portions of the top electrode 106 layer and PCM 102 layer may be protected by the resist and retained and may form respective PCM stacks, though only one PCM stack 210 is depicted. The heating layer 132 may be utilized as an etch stop in the etching of portions of top electrode 106 layer and PCM 102 layer.

Deuterium anneal 202 may be performed at the present fabrication stage, after PCM stack 210 formation. The present structure of IC device 200 may be placed in a sealed environment. The atmosphere of the sealed environment is purged with, or pumped to a base pressure and backfilled with, a deuterium-containing gas. The partial pressure of the deuterium-containing gas in the anneal ambient can be sub-atmospheric, atmospheric, or super-atmospheric depending on the apparatus in which the anneal is performed. In one embodiment, the anneal ambient can consist essentially of a deuterium-containing gas. The temperature of the anneal can be in a range from 350 degrees Celsius to 450 degrees Celsius, although lower and higher temperatures can also be employed. The duration of the anneal can be in a range from 60 minute to 2 hours, although lesser and greater durations can also be employed.

During the deuterium anneal 202, deuterium atoms impinge on the exposed side surfaces of the PCM 102 and diffuse into the PCM 102 forming deuterium 105 within the PCM 102. Hydrogen atoms within the PCM 102 and/or at PCM 102 and surrounding material interfaces and are replaced with deuteron atoms during the anneal in the anneal environment that includes the deuterium-containing gas. Also, some dangling bonds or traps inside the PCM 102 and/or at PCM 102 are bonded by deuterium atoms during the anneal. The processing parameters of deuterium anneal 202 can be selected so that the density of deuterium 105 within PCM 102 reduces the active defects in the amorphous phase of PCM 102 by passivating dangling bonds, which results in PCM 102 becoming easier to nucleate during the SET process. Resultantly, the addition of deuterium 105 within PCM 102 relatively increases the SET programming voltage window of the PCM memory cell 100 that includes PCM 102 with deuterium 105 therein, compared with a similar PCM cell without.

FIG. 6 depicts a cross-sectional view of a fabrication stage of fabricating IC device 200 that includes PCM memory cell 100 that is fabricated to include PCM 102 that contains deuterium 105 therein. At the present stage, encapsulation spacer 108 layer is formed upon heating layer 132 and upon and around PCM stack 210.

Encapsulation spacer 108 layer may be a dielectric material layer that helps prevent or limit shorting between the neighboring PCM stacks, though only one PCM stack 210 is depicted. Encapsulation spacer 108 may be a dielectric material layer that helps prevent or limit shorting between various layers within one PCM stack 210. For example, encapsulation spacer 108, depicted in FIG. 8, formed from encapsulation spacer 108 layer may help prevent heater 130 and top electrode 106 from undesirably shorting.

Encapsulation spacer 108 layer may be formed by depositing a dielectric conformal and insulating material, such as Silicon Nitride, Silicon Oxide, Silicon oxynitride, amorphous Carbon, Aluminium nitride, or the like, upon the exposed heating layer 132 and upon and around the PCM stack 210. For example, encapsulation spacer 108 may be formed by depositing a blanket dielectric material layer upon the exposed heating layer 132, upon the sidewall(s) or side surface(s) of PCM stack 210, and upon the upper surface PCM stack 210.

The thickness of the encapsulation spacer 108 layer may be sufficiently thick to protect the PCM stack 210 during subsequent etching of the undesired portions of the encapsulation spacer 108 such that the undesired the encapsulation spacer 108 may be removed from the field while being retained upon the PCM stack 210 sidewall(s) or side surface(s). For example, encapsulation spacer 108 may be formed to a thickness between 2 and 100 nm. In a particular embodiment, encapsulation spacer 108 may be formed to a thickness between 10 and 20 nm.

FIG. 8 depicts a cross-sectional view of a fabrication stage of fabricating IC device 200 that includes PCM memory cell 100 that is fabricated to include PCM 102 that contains deuterium 105 therein. At the present stage, encapsulation spacer 108 is formed around the PCM stack 210 from the encapsulation spacer 108 layer and deuterium anneal 202 may be performed to diffuse deuterium within the PCM 102.

Encapsulation spacer 108 may be formed by removing undesired encapsulation spacer 108 layer portion(s) and retaining desired encapsulation spacer 108 layer portion(s) that are upon the sidewall(s) of PCM stack 210. Directional etch techniques may be utilized to etch away or otherwise remove the undesired encapsulation spacer 108 portion(s). Undesired encapsulation spacer 108 portion(s) may be generally horizontal. The directional etch process may retain the desired and generally vertical encapsulation spacer 108 portion(s) that are upon the sidewall(s) of the PCM stack 210. The etch technique may be a physical or dry etch technique, or a chemical wet etch. In a preferred implementation, the etch technique is a chemical wet etch. As such, the heater layer 132 may be configured to be a etch stop.

Deuterium anneal 202 may be performed at the present fabrication stage, after encapsulation spacer 108 formation. The present structure of IC device 200 may be placed in a scaled environment. The atmosphere of the sealed environment is purged with, or pumped to a base pressure and backfilled with, a deuterium-containing gas. The partial pressure of the deuterium-containing gas in the anneal ambient can be sub-atmospheric, atmospheric, or super-atmospheric depending on the apparatus in which the anneal is performed. In one embodiment, the anneal ambient can consist essentially of a deuterium-containing gas. The temperature of the anneal can be in a range from 300 degrees Celsius to 400 degrees Celsius, although lower and higher temperatures can also be employed. The duration of the anneal can be in a range from 60 minute to 2 hours, although lesser and greater durations can also be employed.

During the deuterium anneal 202, deuterium atoms impinge on PCM 102 and diffuse into the PCM 102 forming deuterium 105 within the PCM 102. Because top electrode 106 and encapsulation spacer 108 exists at the present stage, a relatively fewer quantity of deuterium 105 atoms impinges on PCM 102 and diffuses into the PCM 102 forming a relatively lower concentration deuterium 105 within the PCM 102. The processing parameters of deuterium anneal 202 can be selected so that the density of deuterium 105 within PCM 102 reduces the active defects in the amorphous phase of the PCM 102 by passivating dangling bonds, which results in the PCM 102 becoming easier to nucleate during the SET process. As a result, the addition of deuterium 105 within the PCM 102 relatively increases the SET programming voltage window of the PCM memory cell, compared with a similar PCM cell without the deuterium.

In an example, there may be a homogenous concentration of deuterium within the PCM 102. In another example, there may be a heterogenous concentration of deuterium through the PCM 102 from a relatively high concentration of deuterium at the exposed surface(s) of the PCM 102 in which the deuterium impinges on PCM 102 to a relatively low concentration of deuterium at a central or most inner portion of the PCM that is most away from the exposed surface(s) of the PCM 102. Such change in concentration of deuterium may be gradual or graded where the concentration of deuterium passes gradually from one concentration level into another concentration level.

Figure 9:
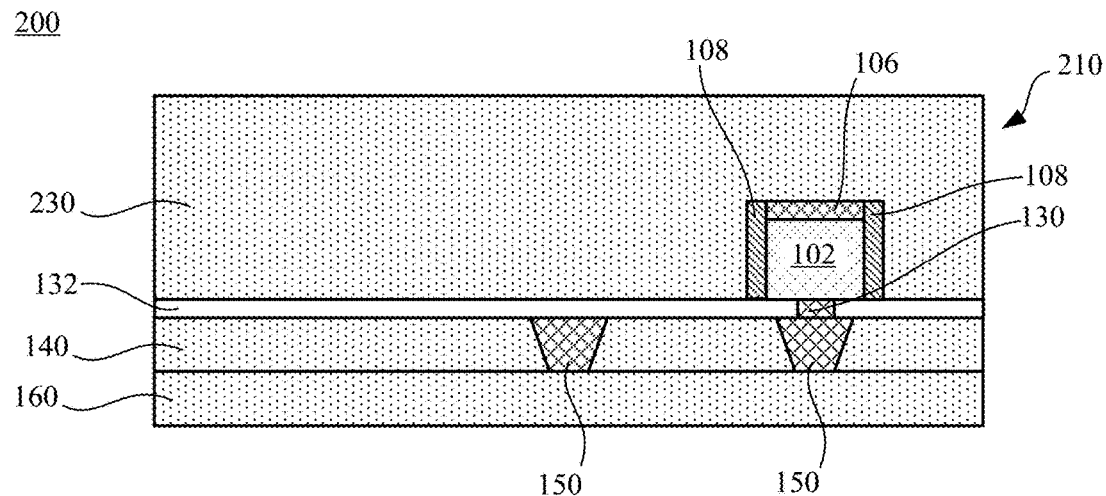

FIG. 9 depicts a cross-sectional view of a fabrication stage of fabricating IC device 200 that includes PCM memory cell 100 that is fabricated to include PCM 102 that contains deuterium 105 therein. At the present stage, interlayer dielectric 230 is formed around the PCM stack 210 and upon heater layer 132.

Interlayer dielectric 230 may be formed by depositing a blanket layer of dielectric material, such as a low-k dielectric material, upon the heater layer 132, upon encapsulation spacer 108, and upon top electrode 106. Interlayer dielectric 230 may be formed to a thickness generally greater than the height, or generally above, the upper surface of top electrode 106.

In some implementations, interlayer dielectric 230 can have a composition that is selected from the group consisting of silicon-containing materials such as $SiO_2$, $Si_3N_4$, $SiO_xN_y$, SiC, SiCO, SiCOH, and SiCH compounds, the above-mentioned silicon-containing materials with some or all of the Si replaced by Ge, carbon doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and diamond-like carbon (DLC), also known as amorphous hydrogenated carbon, α-C:H.

In embodiments, the interlayer dielectric 230 is an oxide-based material (e.g., $SiO_2$, SiN, or the like), which can be deposited by a deposition method, e.g., chemical vapor deposition (CVD) upon substrate 160. The interlayer dielectric 230 can also be a low-k dielectric material (material with a lower dielectric constant relative to $SiO_2$), an insulator material with porosity, or the like.

Figure 10:
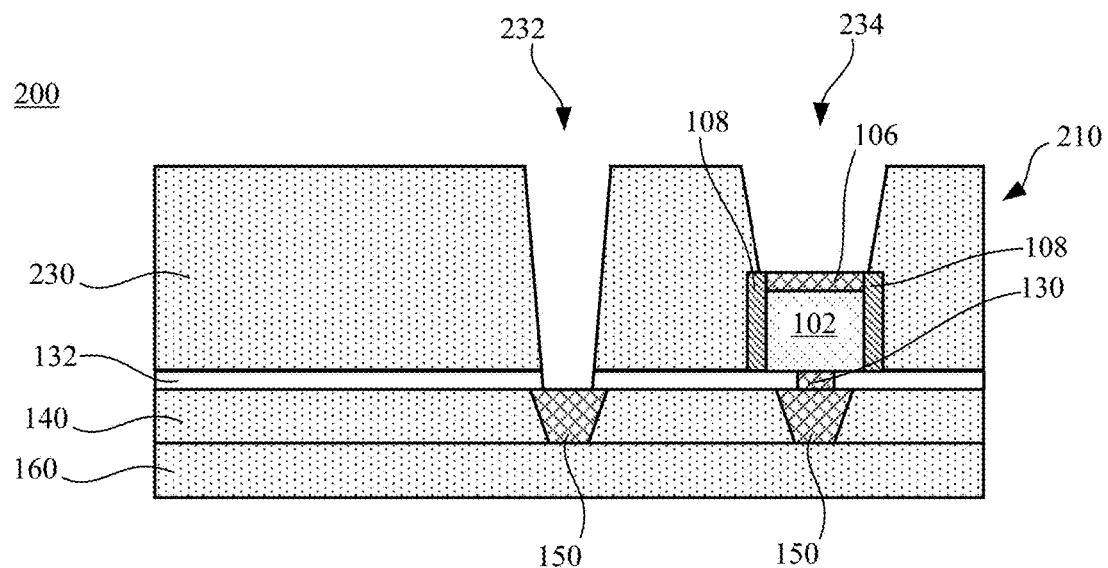

FIG. 10 depicts a cross-sectional view of a fabrication stage of fabricating IC device 200 that includes PCM memory cell 100 that is fabricated to include PCM 102 that contains deuterium 105 therein. At the present stage, top wire trench 232, 234 are formed within interlayer dielectric 230.

The top wire trench 232, 234 can be formed by lithography and etching methods. For example, a resist formed over the interlayer dielectric 230 is exposed to energy (light) to form a pattern (opening, trench, etc.). An etching process with a selective chemistry, e.g., reactive ion etching (RIE), will be used to form one or more patterns in the interlayer dielectric 230 through the openings of the resist. The resist can then be removed by a conventional oxygen ashing process or other known stripants. In an example, top wire trench 234 exposes at least a portion of the upper surface of top electrode 106 of PCM stack 210. In another example, top wire trench 234 exposes the entire upper surface of top electrode 106 of PCM stack 210. In an example, top wire trench 232 exposes at least a portion of the upper surface of bottom electrode 150.

FIG. 11 depicts a cross-sectional view of a fabrication stage of fabricating IC device 200 that includes PCM memory cell 100 that is fabricated to include PCM 102 that contains deuterium 105 therein. At the present stage, top wire 242, 244 are formed within top wire trench 232, 234 and deuterium anneal 202 may be performed.

Following the resist removal, conductive material can be deposited in the one or more patterns or top wire trenches 232, 234 by any conventional deposition processes, e.g., chemical vapor deposition (CVD) processes to form top wire 242, 244, respectively. Top wire 242, 244 can be composed of any conductive material such as, e.g., Cu, W, Co, Ni, Al, Ru, etc. In a particular implementation, the top wire 242, 244 are composed of Cu. The top wire 242, 244 can also be lined with a conductive barrier layer formed from Ti, Ta, TiN, TaN, Ru, Co, etc. Any residual conductive material on the upper surface of the interlayer dielectric 230 can be removed by chemical mechanical polishing (CMP) processes.

Top wire 242, 244 may be electrically connected to other components of the IC device 200 and/or electrical components connected to IC device 200 by one or more electrical pathways. For example, top wire 244 may be apart of one or more electrical pathways (e.g., VIAs, wires, or the like) that may connect top electrode 106 with a memory controller, or the like. In this manner, components of the IC device 200, or connected to the IC device 200, may be electrically connected to the PCM memory cell 100 via the top electrode 106. Top wire 242, 244 may comprise a wire and vertical interconnect access (VIA) to make physical and electrical contact with a respective underlying conductive feature.

Deuterium anneal 202 may be performed at the present fabrication stage, after top wire 244 formation. The present structure of IC device 200 may be placed in a sealed environment. The atmosphere of the sealed environment is purged with, or pumped to a base pressure and backfilled with, a deuterium-containing gas. The partial pressure of the deuterium-containing gas in the anneal ambient can be sub-atmospheric, atmospheric, or super-atmospheric depending on the apparatus in which the anneal is performed. In one embodiment, the anneal ambient can consist essentially of a deuterium-containing gas. The temperature of the anneal can be in a range from 300 degrees Celsius to 400 degrees Celsius, although lower and higher temperatures can also be employed. The duration of the anneal can be in a range from 60 minute to 2 hours, although lesser and greater durations can also be employed.

During the deuterium anneal 202, deuterium atoms impinge on PCM 102 and diffuse into the PCM 102 forming deuterium 105 within the PCM 102. Because of the presence of interlayer dielectric 230, top wire 244, top electrode 106, and encapsulation spacer 108 at the present stage, a relatively fewer quantity of deuterium 105 atoms impinges on PCM 102 and diffuses into the PCM 102 forming a relatively lower concentration deuterium 105 within the PCM 102. The processing parameters of deuterium anneal 202 can be selected so that the density of deuterium 105 within PCM 102 reduces the active defects in the amorphous phase of the PCM 102 by passivating dangling bonds, which results in the PCM 102 becoming easier to nucleate during the SET process. As a result, the addition of deuterium 105 within the PCM 102 relatively increases the SET programming voltage window of the PCM memory cell, compared with a similar PCM cell without the deuterium.

In an example, there may be a homogenous concentration of deuterium within the PCM 102. In another example, there may be a heterogenous concentration of deuterium through the PCM 102 from a relatively high concentration of deuterium at the exposed surface(s) of the PCM 102 in which the deuterium impinges on PCM 102 to a relatively low concentration of deuterium at a central or most inner portion of the PCM that is most away from the exposed surface(s) of the PCM 102. Such change in concentration of deuterium may be gradual or graded where the concentration of deuterium passes gradually from one concentration level into another concentration level.

Figure 12:
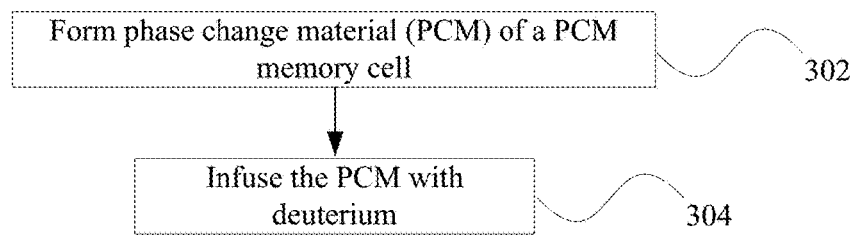
FIG. 12 depicts an integrated circuit (IC) device fabrication method, in accordance with various embodiments of the present disclosure.

FIG. 12 depicts an integrated circuit (IC) device fabrication method 300, in accordance with various embodiments of the present disclosure. Method 300 may be utilized to form IC device 200, such as a processor, microprocessor, memory, FPGA, or the like, IC device 200 that includes PCM memory cell 100 that is fabricated to include PCM 102 that contains deuterium 105 therein. Method 300 includes, at block 302, forming phase change material (PCM) 102 of PCM memory cell 100. For example, PCM 102 layer may be formed upon heater layer 132 and upon heater 130, PCM stack 210 which comprises the patterned PCM 102 may be formed, or the like. Method 300 continues, at block 304, with infusing the PCM 102 with deuterium. For example, PCM 102 may be annealed in a deuterium environment, also referred herein to the deuterium anneal 202 to infuse deuterium 105 within the PCM 102. For example, deuterium anneal 202 may be performed upon the PCM 102 layer, as depicted in FIG. 4, deuterium anneal 202 may be performed upon the patterned PCM 102, as depicted in FIG. 6, deuterium anneal 202 may be performed upon the PCM stack 210 after encapsulation spacer 108 formation, as depicted in FIG. 8, deuterium anneal 202 may be performed upon the PCM stack 210 after top wire 244 formation, as depicted in FIG. 11.

Figure 13:
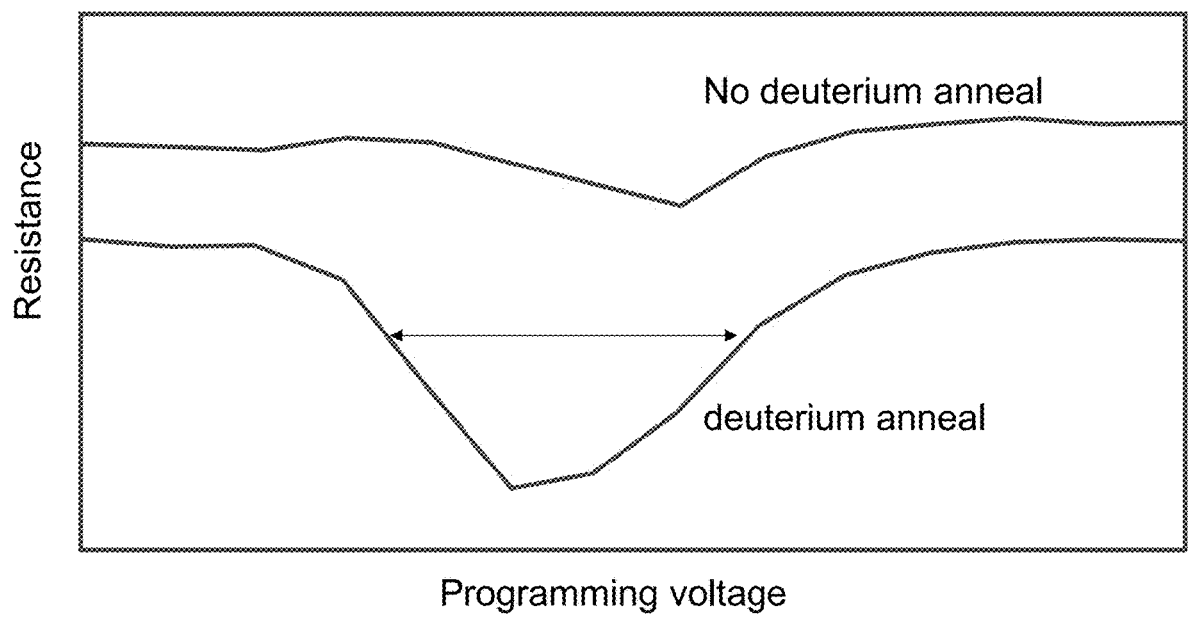
FIG. 13 depicts a schematic view of the Resistance-Voltage (R-V) characteristic of the PCM memory cell with deuterium therein with a relatively large SET programming voltage window, compared with a PCM cell without deuterium therein.

FIG. 13 depicts a schematic view of the Resistance-Voltage (R-V) characteristic of the PCM memory cell 100 with deuterium 105 therein with a relatively large SET programming voltage window, compared with a PCM cell without deuterium therein. The PCM cell resistances are measured as a function of a voltage pulse with constant pulse width (e.g., 50 ns). The density of deuterium 105 within PCM 102 reduces the active defects in the amorphous phase of PCM 102 by passivating dangling bonds, which results in PCM 102 becoming easier to nucleate during the SET process. Generally, the crystallization transformation of PCM 102 can be divided into two processes: (1) a crystal-nucleation process and (2) a crystal-growth process. When the crystal nuclei appear in the melted amorphous material at elevated temperature, these nuclei can then gradually grow larger, and the whole active region of PCM 102 will be in the crystalline state, which is equivalent to the transformation from RESET to SET state. As such, and as depicted in the schematic view of FIG. 13, addition of deuterium 105 within PCM 102 relatively increases the SET programming voltage window, as indicated by the dual sided arrow, of the PCM memory cell 100 that includes PCM 102 with deuterium 105 therein, compared with a similar PCM cell without.

References herein to terms such as "vertical", "horizontal", etc. are made by way of example, and not by way of limitation, to establish a frame of reference. The term "horizontal" as used herein is defined as a plane parallel to the conventional plane or surface of the substrate 160, regardless of the actual spatial orientation of the substrate 160. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present disclosure without departing from the spirit and scope of the present disclosure.

What is claimed is:

1. A phase change material memory cell comprising:
    a top electrode in contact with a phase change material (PCM) in which application of an electrical potential to the PCM changes a detectable resistance of the PCM that represents a data value, the PCM comprising a graded concentration of infused deuterium from a high concentration of deuterium at a first surface of the PCM to lower concentrations of deuterium away from the first surface of the PCM.

2. The phase change material memory cell of claim 1, further comprising:
    the top electrode upon an upper surface of the PCM; and
    a heater upon a lower surface of the PCM, wherein the PCM is serially connected to both the top electrode and the heater.

3. The phase change material memory cell of claim 2, further comprising:
    an encapsulation spacer upon a sidewall of the PCM and upon a sidewall of the top electrode.

4. The phase change material memory cell of claim 3, further comprising:
    a top wire connected to an upper surface of the top electrode.

5. The phase change material memory cell of claim 4, wherein the graded concentration of infused deuterium relatively increases a SET programming voltage window of the phase change material memory cell.

6. The phase change material memory cell of claim 1, wherein the first surface of the PCM is a side surface of the PCM.

7. The phase change material memory cell of claim 1, wherein the first surface of the PCM is an upper surface of the PCM.

8. The phase change material memory cell of claim 2, wherein the electrical potential applied to the PCM is applied to the heater.

9. An integrated circuit (IC) device fabrication method comprising:
    forming a heater layer upon an underlying layer;
    forming a heater within the heater layer, the heater being formed above and vertically in-line with an underlying bottom wire;
    forming a phase change material (PCM) layer upon the heater and upon the heater layer; and
    infusing deuterium within the PCM layer, the deuterium having a high concentration of at an upper surface of the PCM layer to lower concentrations of the deuterium vertically away from the upper surface of the PCM layer.

10. The IC device fabrication method of claim 9, further comprising:
    forming a top electrode layer directly upon the PCM layer; and
    patterning the top electrode layer and the PCM layer to form a PCM cell stack, the PCM cell stack comprising a PCM and a top electrode, wherein application of an electrical potential to the PCM changes a detectable resistance of the PCM, and wherein the detectable resistance of the PCM represents a data value.

11. The IC device fabrication method of claim 10, further comprising:
    forming an encapsulation spacer upon a sidewall of the PCM cell stack.

12. The IC device fabrication method of claim 11, further comprising:
    forming an inter-layer dielectric (ILD) layer comprising an ILD top surface above a top surface of the PCM cell stack.

13. The IC device fabrication method of claim 12, further comprising:
    forming a top wire within the ILD layer, wherein the top wire is electrically serially connected to the top electrode of the PCM cell stack.

14. An integrated circuit (IC) device fabrication method comprising:
    forming a heater layer upon an underlying layer;
    forming a heater within the heater layer, the heater being formed above and vertically in-line with an underlying bottom wire;
    forming a phase change material (PCM) layer upon the heater and upon the heater layer;
    forming a top electrode layer directly upon the PCM layer;
    patterning the top electrode layer and the PCM layer to form a PCM cell stack, the PCM cell stack comprising a PCM and a top electrode, wherein application of an electrical potential to the PCM changes a detectable resistance of the PCM, and wherein the detectable resistance of the PCM represents a data value; and
    after forming the PCM cell stack, infusing deuterium within the PCM.

15. The IC device fabrication method of claim 14, further comprising:
    forming an encapsulation spacer upon a sidewall of the PCM cell stack.

16. The IC device fabrication method of claim 15, further comprising:
    forming an inter-layer dielectric (ILD) layer comprising an ILD top surface above a top surface of the PCM cell stack.

17. The IC device fabrication method of claim 16, further comprising:
    forming a top wire within the ILD layer, wherein the top wire is electrically serially connected to the top electrode of the PCM cell stack.

18. The IC device fabrication method of claim 14, wherein a concentration of the infused deuterium is graded from a high concentration of deuterium at a side surface of the PCM layer to lower concentrations of the deuterium toward a center of the PCM layer.

* * * * *